United States Patent [19]
Kondo et al.

[11] Patent Number: 5,120,473
[45] Date of Patent: Jun. 9, 1992

[54] METALLIZING COMPOSITION FOR USE WITH CERAMICS

[75] Inventors: Kazuo Kondo; Asao Morikawa, both of Aichi, Japan

[73] Assignee: NGK Spark Plug Co., Ltd., Aichi, Japan

[21] Appl. No.: 256,536

[22] Filed: Oct. 12, 1988

[30] Foreign Application Priority Data

Oct. 12, 1987 [JP] Japan .................. 62-254595
Feb. 9, 1988 [JP] Japan .................. 63-26656

[51] Int. Cl.$^5$ .............................. H01B 1/06
[52] U.S. Cl. .................. 252/512; 252/514; 252/518
[58] Field of Search .............. 252/512, 514, 518

[56] References Cited

U.S. PATENT DOCUMENTS

| 4,172,919 | 10/1979 | Mitchell | 252/512 |
| 4,552,691 | 11/1985 | Shoji et al. | 252/512 |
| 4,623,482 | 11/1986 | Kuo | 252/518 |
| 4,687,597 | 8/1987 | Suita | 252/514 |
| 4,695,403 | 9/1987 | Nishimura et al. | 252/514 |

FOREIGN PATENT DOCUMENTS 288484 12/1986 Japan .
292393 12/1986 Japan .
292394 12/1986 Japan .
289896 1/1988 Japan .
295491 12/1988 Japan .

Primary Examiner—Josephine Barr
Attorney, Agent, or Firm—Sughrue, Mion, Zinn, Macpeak & Seas

[57] ABSTRACT

A metallizing composition for use with ceramics which comprises 100 parts by weight of a CuO-Cu combination consisting of 30 to 70 wt % CuO and 70 to 30 wt % Cu, at least one inorganic component selected from the group consisting of not more than 10 parts by weight of $MnO_2$, not more than 7 parts by weight of Pt and not more than 5 parts by weight of Au, an organic binder, and a solvent.

2 Claims, 1 Drawing Sheet

METALLIZING COMPOSITION FOR USE WITH CERAMICS

FIELD OF THE INVENTION

The present invention relates to a low-melting point and low-resistance electroconductive material that can be fired simultaneously with ceramics of low firing temperature the surface of which is to be metallized. More particularly, the present invention relates to a metallizing composition that is suitable for use in the fabrication of high-density multilayer wiring boards and packages.

BACKGROUND OF THE INVENTION

The demand for increasing the packing density of IC packages, multilayer wiring boards and other products of microelectronics is constantly growing and this has caused the need to develop commercially feasible low-dielectric constant ceramics and low-resistance conductors. Metals that have been commonly employed to make metallizing compositions are noble metals such as Au, Au-Pt, Ag-Pt and Ag-Pd, as well as high-melting point base metals such as W, Mo and Mo-Mn. Paste of noble metals such as Au, Au-Pt, Ag-Pt, and Ag-Pd have the advantage that it can be fired in air but, on the other hand, it suffers from the problem of high cost. The high-melting point metals such as W, Mo, and Mo-Mn have the advantage that they can be easily formed in multiple layers since they can be fired simultaneously with ceramics at about 1,600° C. or the temperature at which green ceramic sheets are sintered. Problems with these high melting point metals are low electroconductivity, potential hazard in operations that require firing in a reducing atmosphere, and the need to plate the conductor surface with Ni and other suitable metals to enable soldering. Under these circumstances, use has increased of ceramic wiring boards that employ Cu paste that is inexpensive and which offers high electroconductivity and good solderability.

A problem with this Cu paste is that in the manufacture of ceramic wiring boards, it is difficult to completely combust the organic matter in the paste without causing oxidation of Cu. If the Cu surface is oxidized, not only is the solderability of the paste impaired but its electroconductivity is also reduced. If care is taken to avoid the generation of CuO, the organic binder and other materials will remain without being completely burned away.

Another problem with the use of metallic Cu is that even if the step of removing the binder is separated from the step of Cu firing, the metallic Cu is oxidized to CuO in the step of binder removal and this causes an expansion in volume, leading to various problems such as separation from the substrate.

The Cu paste presents other problems when using it in the fabrication of multilayer wiring boards; the need to perform firing each time after printing and drying operations have been completed results in a prolonged lead time, as well as an increase in the initial cost.

With a view to solving these problems, various proposals have been made; JP-A-61-288484 (the term "JPA" as used hereinafter means an unexamined published Japanese patent application) discloses a metallizing composition comprising CuO, MnO, a binder, a plasticizer and an organic solvent; JP-A-61-292393 discloses a metallizing composition comprising CuO, an inorganic solid component, a binder, a plasticizer and an organic solvent; and JP-A-61-292394 discloses a metallizing composition comprising at least one metallic component selected from the group consisting of CuO, MnO, Pt, Pd and Ni, a vehicle and a solvent. However, none of these proposals is particularly directed to metallic Cu.

The present inventors previously proposed in Japanese Patent Application No. 62-129441 a metallizing composition based on CuO and Cu that was particularly intended for use in a high-density multilayered ceramic wiring board and with which through-holes were to be filled to ensure satisfactory current conduction by a conductor. They also described in Japanese Patent Application No. 62-122486 that a metallizing composition based on Cu and CuO is suitable for use in the manufacture of high-density multilayered wiring boards since it produces an air-tight and strong adhesion to the ceramics and crystallizable glass in the substrate.

SUMMARY OF THE INVENTION

An object, therefore, of the present invention is to provide a metallizing composition which is a further improvement of the compositions described in Japanese Patent Application Nos. 62-129441 and 62-122486.

This object of the present invention can be attained by a metallizing composition for use with ceramics which comprises 100 parts by weight of a CuO-Cu combination consisting of 30 to 70 wt % CuO and 70 to 30 wt % Cu, at least one inorganic component selected from among up to 10 parts by weight of $MnO_2$, up to 7 parts by weight of Pt and up to 5 parts by weight of Au, an organic binder and a solvent. This metallizing composition provides a dense and highly electroconductive layer that will not develop any crack or delamination.

DETAILED DESCRIPTION OF THE INVENTION

Figure 1A:
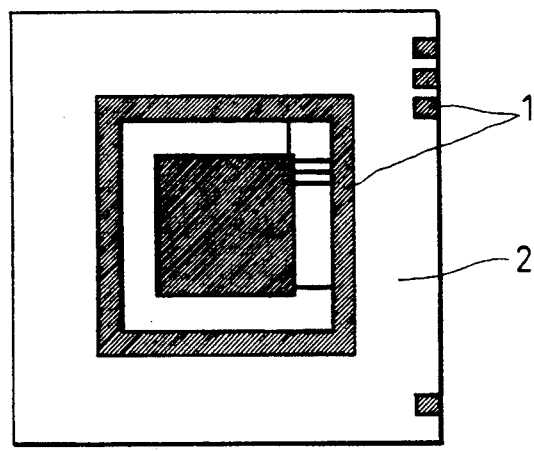
FIG. 1 includes a plan view (A) of a chip carrier package fabricated with the metallizing composition of the present invention and a cross section (B) of the package.

The CuO and Cu in the metallizing composition of the present invention are rendered conductive by heating with a ceramic green sheet in either a reducing or an inert atmosphere. The proportions of CuO and Cu are limited to be within the range of 30 to 70 wt % CuO and 70 to 30 wt % Cu in order to minimize the total volume change by cancelling out the effects of volume expansion that occurs due to Cu oxidation in the degreasing step and the volume contraction that occurs due to CuO reduction in the reducing step. If the CuO to Cu ratio is outside the range set forth above, the intended results will not be attained; for instance, if the CuO/Cu ratio is 80:20, air-tightness is not attainable, and if the CuO/Cu ratio is 20:80, a volume increment will occur on account of oxidation in the degreasing step and delamination of a metallized layer can take place.

The content of $MnO_2$ in the composition of the present invention is limited to be no more than 10 parts by weight per 100 parts by weight of the sum of CuO and Cu. Manganese dioxide ($MnO_2$), when reduced, turns to $Mn_2O_3$, MnO or Mn and increases the ability of copper to wet the ceramics or crystallized glass in the substrate. If the content of $MnO_2$ is over 10 parts by weight, the sinterability of copper particles is impaired, causing leakage damage or increased resistance.

Platinum and gold cooperate with Cu and CuO to serve to ensure the necessary electrical conductivity. In addition to this advantage, Pt and Au, which sparingly undergo oxidation or reduction at elevated temperatures, contribute to maintaining a near constant overall volume of the conductor. If the content of Pt is 7 parts or more by weight, the conductor will have an increased resistance which is somewhat unfavorable for the purpose of providing interconnection through a plurality of holes extending through multiple layers. If the content of Au is 5 parts or more by weight, it will form an alloy with Cu, producing coarse metallizing particles which fail to ensure the necessary air-tightness.

There is no particular limitation on the organic binder and the solvent to be used in the metallizing composition of the present invention and any organic binder and solvent that are commonly employed in known metallizing compositions can be used. Examples of these ingredients are polyvinylbutyral, polyvinylformal, polyvinylchloride, polyvinylacetate, or acrylic resin, as a binder; toluene or methylethylketone as a solvent; and dibutylphthalate or diethylene glycol as a plastisizer. The amounts of organic binder and solvent may be properly adjusted to the viscosity and concentration that are adapted for a specific method selected for coating the metallizing composition. For instance, the organic binder and solvent are typically used in respective amounts of about 10 and about 30 parts by weight per 100 parts by weight of the sum of Cu and CuO.

The metallizing composition which is based on CuO and Cu has low electrical resistance and is suitable for the purpose of metallizing crystallized glass ceramics which are low in both permittivity and thermal expansion ratio. This composition is therefore effective in providing a highly air-tight metallizing layer when used in packaging a multilayered wiring board.

The following example is provided for the purpose of describing an outline of a process for fabricating a product that utilizes the metallizing composition of the present invention. It should, however, be noted that the present invention is by no means limited to this particular example. Unless otherwise indicated, all parts, percents and ratios are by weight.

EXAMPLES 1 TO 9

ZnO, MgCO$_3$, Al(OH)$_3$, SiO$_2$, H$_3$BO$_3$ and H$_3$PO$_4$ were measured in such amounts that they would provide a composition consisting of 4% ZnO, 13% MgO, 23% Al$_2$O$_3$, 58% SiO$_2$, 1% B$_2$O$_3$ and 1% P$_2$O$_5$. These ingredients were mixed in a mixing and grinding machine, melted at 1,450° C. in an alumina crucible, and quenched in water to form a glassy material. This material was ground in an alumina ball mill to produce a frit consisting of glass particles having an average particle size of 2 µm.

An organic binder and a solvent were mixed with the frit to form a slurry, which was shaped into a green sheet of 0.6 mm thickness by doctor blading which is a raw material of a crystallized grass body.

A CuO powder (average particle size, 0.5 to 2 µm), a Cu powder (average particle size, 0.5 to 2.0 µm), a MnO$_2$ powder (average particle size, 3 µm) and a Pt powder (average particle size, 0.5 µm) or a Au powder (average particle size, 1 to 3 µm) were mixed in the proportions shown in Table 1 below. The resulting formulations were mixed with an organic binder (ethyl cellulose) and a solvent (butyl carbitol) and kneaded in an agate mortar to form samples of metallized paste having the compositions shown in Table 1 according to the present invention.

TABLE 1

| Example Nos. | CuO + Cu totalling 100 parts | | MnO$_2$ (parts) | Pt (parts) | Au (parts) |
|---|---|---|---|---|---|
| | CuO (%) | Cu (%) | | | |
| 1 | 50 | 50 | 2 | powder (0.5 µm*) 3 | 2 |
| 2 | 40 | 60 | 2 | metal resinate 2 | 2 |
| 3 | 40 | 60 | 3 | metal resinate 3 | 2 |
| 4 | 30 | 70 | 7 | 0 | 0 |
| 5 | 30 | 70 | 0 | powder (0.5 µm) 3 | 2 |
| 6 | 70 | 30 | 5 | powder (0.5 µm) 7 | 5 |
| 7 | 50 | 50 | 1 | powder (0.5 µm) 5 | 3 |
| 8 | 60 | 40 | 1 | powder (0.5 µm) 1 | 1 |
| 9 | 30 | 70 | 0.5 | 0 | 0 |

Remarks *a size in parentheses is average particle size of the powder.

A circuit pattern consisting of 40 conductor strips (40 mm length × 0.5 mm width × 20 µm thickness) spaced at a distance of 1 mm was formed by screen-printing the metallizing paste on the surface of the green sheet made of crystallizable glass.

Through holes (300 µm in diameter) were formed in 200 selected locations of the striped circuit pattern and a similar circuit pattern of strips was formed by screen-printing the metallizing composition described in Japanese Patent Application No. 62-129441 on positions where the latter strips would cross over the through-holes at right angles with respect to the strips in the first pattern of the metallizing paste, with the through-holes being filled with the metallizing composition.

Six layers of the patterned green sheet were superposed on a single unpatterned base sheet that was much thicker than the individual green sheets, and the seven layers were thermocompressed to form a unitary assembly which was subsequently cut into squares measuring 50 mm × 50 mm.

The resulting cut pieces of the assembly were heated in an air atmosphere up to 750° C. over a period of 8 hours and held at that temperature for 0.2 to 1.0 hour.

The pieces were then transferred into a hydrogen atmosphere, in which they were heated from ambient or room temperature to 350° C. at a rate of 0.5° C./min, hold at that temperature for 0.5 to 1.5 hours, and fired at 950° C. in a hydrogen or inert atmosphere.

Figure 1B:
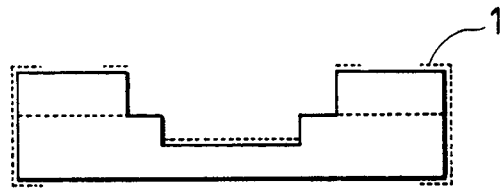

Multilayered boards were fabricating using the metallizing composition of the present invention and subjected to both an air-tightness test and an environmental test. The structure of the multilayered boards under test is shown in FIG. 1. In the chip carrier package shown in FIG. 1, numeral 1 denotes the metallized layer formed of the metallizing composition of the present invention, and numeral 2 signifies a substrate made of a ceramic body such as crystallized glass which is capable of being fired at low temperatures.

Air-tightness measurements were conducted with a He detector. All of the samples under test showed values of not more than $1.0 \times 10^{-8}$ Std, cc/sec, nor did they experience any deterioration in the environmental test. The environmental test conditions were as follows:

| (1) temperature cycle | (−65 to 200° C.) | 10 cycles |
|---|---|---|
| (2) thermal shock | (0 to 100° C.) | 15 cycles |
| | (−55 to 125° C.) | 15 cycles |
| | (−65 to 150° C.) | 100 cycles |

Similar tests were conducted on multilayered boards employing as the substrate, the crystallized glass bodies, described in JP-A-59-92943, JP-A-59-83957, JP-A-59-137341, and JP-A-59-129441. The metallizing composition of the present invention also proved to be effective with these substrates. It was also found that this composition was effective with low-temperature firing substrates in general.

COMPARATIVE EXAMPLE

Japanese Patent Application No. 61-294459 discloses a metallizing composition "containing at least 80% of copper or copper oxide in terms of Cu, as well as up to 12% of $MnO_2$ and up to 8% of $Ag_2O$". In a comparative test, a paste was prepared from a composition that was included within this range and which consisted of 96.5% of CuO (average particle size, 1.5 μm) in terms of Cu, 2.5% of $MnO_2$ and 1.0% of $Ag_2O$, but the air-tightness of layers formed of this paste was unstable on account of variations that occurred in the degree of contraction of the ceramic substrate during firing. When the degree of contraction that would occur in the ceramic substrate was held to be no more than 25%, high air-tightness was not attainable, either. The air-tightness of the metallized layer formed on a substrate having the same composition as used in the Example was $1 \times 10^{-6}$ Std, cc/sec. The degree of contraction occurring in the firing step was calculated by the following formula:

Degree of contraction (%) =

$$\frac{\text{dimensions before firing} - \text{dimensions after firing}}{\text{dimensions before firing}} \times 100$$

As described in Japanese Patent Application No. 61-294459, the degree of contraction that would occur in a ceramic substrate during firing was increased to 25% and above in the prior art so as to produce a dense metallized copper layer on the ceramic substrate. In comparison, the composition of the present invention enables the production of a metallized Cu layer which is dense by itself, so a satisfactory degree of air-tightness can be obtained even if the ceramic substrate is fired to undergo no more than 25% contraction.

While the invention has been described in detail and with reference to specific embodiments thereof, it will be apparent to one skilled in the art that various changes and modifications can be made therein without departing from the spirit and scope thereof.

What is claimed is:

1. A metallizing composition for use with ceramics which comprises 100 parts by weight of a CuO-Cu combination consisting of 30 to 70 wt % CuO and 70 to 30 wt % Cu, at least one inorganic component selected from the group consisting of not more than 10 parts by weight of $MnO_2$ per 100 parts by weight of the CuO-Cu combination, not more than 7 parts by weight of Pt per 100 parts by weight of the CuO-Cu combination, and not more than 5 parts by weight of Au per 100 parts by weight of the CuO-Cu combination, an organic binder, and a solvent.

2. The metallizing composition according to claim 1, wherein the ceramics are of a green sheet.

* * * * *